(12) United States Patent
Melsa

(10) Patent No.: US 7,031,457 B2
(45) Date of Patent: *Apr. 18, 2006

(54) PROGRAMMABLE PEAK DETECTOR FOR USE WITH ZERO-OVERHEAD CLASS G LINE DRIVERS

(75) Inventor: Peter J. Melsa, Niles, MI (US)

(73) Assignee: Texas Instruments Incorporated, Dallas, TX (US)

( * ) Notice: Subject to any disclaimer, the term of this patent is extended or adjusted under 35 U.S.C. 154(b) by 732 days.

This patent is subject to a terminal disclaimer.

(21) Appl. No.: 09/997,527

(22) Filed: Nov. 30, 2001

(65) Prior Publication Data

US 2003/0107412 A1    Jun. 12, 2003

(51) Int. Cl.
*H03F 3/04* (2006.01)

(52) U.S. Cl. .................. 379/399.01; 330/297
(58) Field of Classification Search ........... 330/297, 330/136, 285; 379/399.01, 93.07, 473, 398
See application file for complete search history.

(56) References Cited

U.S. PATENT DOCUMENTS

| 4,721,919 | A | | 1/1988 | LaRosa et al. |
| 4,873,493 | A | * | 10/1989 | Fujiwara ................. 330/285 |
| 5,929,702 | A | * | 7/1999 | Myers et al. ............ 330/136 |
| 6,028,486 | A | * | 2/2000 | Andre ..................... 330/297 |
| 6,323,733 | B1 | * | 11/2001 | Gorcea et al. ........... 330/297 |

FOREIGN PATENT DOCUMENTS

WO    WO 01/67598 A1    9/2001

* cited by examiner

*Primary Examiner*—Sinh Tran
*Assistant Examiner*—Walter F. Briney, III
(74) *Attorney, Agent, or Firm*—Abdul Zindani; W. James Brady, III; Frederick J. Telecky, Jr.

(57) ABSTRACT

A digital input signal is analyzed by a peak detector (210) configurable to trigger a first logic signal (260) if the peak detector detects the digital input signal level crossing a certain threshold. The threshold value can be modified by an overhead. The amplifier (250) employs a plurality of supply rails of differing voltages (253, 255) as a function of the logic signals. A digital signal delay element (220) may delay the signal to allow sufficient time for the amplifier to switch between supply sources. A logic delay element (280) may delay transmittal of the first logic signal by the peak detector to compensate for signal delay caused by a filter. A hold element (270) ensures that the first logic signal is applied to the output amplifier for a given amount of time.

24 Claims, 2 Drawing Sheets

PROGRAMMABLE PEAK DETECTOR FOR USE WITH ZERO-OVERHEAD CLASS G LINE DRIVERS

TECHNICAL FIELD OF THE INVENTION

This invention relates generally to line drivers, and more specifically to a zero-overhead Class G line driver.

BACKGROUND OF THE INVENTION

The amplification and line driving of data signals for transmission, such as for use in digital subscriber lines (DSL), constitutes an important link in the transmission of data signals. The transmitted data signals will probably have a substantially Gaussian distribution: a given percentage of symbols constituting the data signals will have an amplitude below a certain amount, and the rest will have an amplitude above that certain amount. When amplifying these symbols for transmission by a line driver, one has typically set the power supply rail of the line driver amplifier at a higher voltage level sufficient to accommodate the theoretically largest signal amplitude in order to avoid clipping. However, this accommodation may yield excessive power consumption, as much of the time the line driver will not be amplifying the largest signal.

One attempted solution to this problem is the creation and employment of a Class G amplifier. A Class G amplifier may generally be defined as an amplifier, which has associated with it two sub-amplifiers with different operating voltages. In one prior-art embodiment, the Class G amplifier employs two sub-amplifiers coupled in parallel, in which the Class G amplifier's analog circuitry decides which sub-amplifier to use to amplify the data signal. The decision is based upon the amplitude of the data signal, thereby hopefully leading to a power saving while minimizing the odds of clipping data signals.

While prior art Class G amplifiers generally provide improved performance, their performance still involves the possibility of clipping the data signal (because the low operating voltage sub-amplifier is used when the incoming signal is above the threshold) or consuming excessive power (because the high operating voltage sub-amplifier is used when the incoming signal is below the threshold). These inefficiencies can arise because of an inherent inaccuracy in making the threshold determination after the incoming signal has been converted to analog domain and also from the fact that the signal may be distorted by analog filters subsequent to the threshold determination.

For instance, filters may have associated with them a phenomenon known as "group delay distortion". In group delay distortion, different frequencies traversing a set of filters may have different propagation constants due to characteristics associated with the filters. As the various sinusoidal signals are delayed, they may constructively or destructively interfere, yielding an output signal different from the input signal. Constructive interference may cause the zero-overhead amplifier to clip a data signal, as the sub-amplifier was configured for signal data with a lower amplitude. Alternatively, destructive interference may cause the zero-overhead amplifier to waste power, as the sub-amplifier may be needlessly coupled to a rail to accommodate a now-attenuated data signal. These and other problems lead to difficulties in determining the correct triggering threshold for the peak detector circuit when making the determination of the triggering threshold in the digital domain.

Therefore what is needed in the art is a zero-overhead amplifier that overcomes the above-described and other limitations of the prior art.

SUMMARY OF THE INVENTION

In one aspect, the present invention provides for a line driver. The line driver has a signal input. A peak detector receives a digital data signal from the signal input and outputs a first logic value when the digital data signal exceeds a threshold value and a second logic value when the digital data signal is below the threshold value. The threshold value is in turn modifiable by an overhead value. The present invention therefore introduces the broad concept of a threshold calculation employing an overhead to further modify the threshold value.

The line driver further includes a digital data signal delay that delays a digital data signal. In one preferred embodiment, the digital data signal delay is programmable. A DAC coupled to the delayed digital data signal input receives this data and outputs an analog data signal. A filter then receives the analog data signal and outputs a filtered analog data signal. In one preferred embodiment, the digital data signal delay, DAC and a portion of the filter are implemented on one chip, and the remaining part of the Class-G amplifier is implemented on a second chip. In another preferred embodiment, the digital data signal delay, the DAC, all of the filter, and all of the rest of the Class-G amplifier is implemented on one chip.

The line driver further includes inputting a logic signal and the delayed digital data signal. An amplifier receives as input the filtered analog data signal from the filter and the logic signal. The amplifier operates at a first operating voltage level when the logic signal is at the first logic value and operates at a second operating voltage level when the logic signal is at the second logic value. In some embodiments, the present invention provides for additional threshold values and the amplifier is operable at three or more operating levels in response to the logic signals output by the peak detector. In another aspect, the present invention provides for a method of driving a transmission line. The method includes receiving a digital data signal from a signal input and outputting a first logic value when the digital data signal exceeds a threshold value and a second logic value when the digital data signal is below the threshold value. The threshold value is in turn modifiable by an overhead value. The first or second logic value is preferably delayed by a programmable logic delay value.

The method further includes delaying the digital data signal, converting the delayed digital data signal to an analog data signal and filtering the analog data signal. The filtered analog data signal is then passed to an amplifier operable at a first operating voltage level and a second operating voltage level.

The method still further includes amplifying the filtered analog data signal with an amplifier operating at either a first or second operating voltage. The logic signals determine whether the amplifier operates at the first or second operating voltage.

BRIEF DESCRIPTIONS OF THE DRAWINGS

The above features of the present invention will be more clearly understood from consideration of the following descriptions in connection with accompanying drawings in which.

DETAILED DESCRIPTION OF PREFERRED EMBODIMENTS

Details regarding a preferred embodiment "zero-overhead" Class G amplifier ("zero-overhead line driver") are provided in a related application titled "Zero-Overhead Class G Amplifier with Threshold Detection", Ser. No. 10/001,330 and filed on Oct. 31, 2001, now U.S. Pat. No. 6,614,310, which is hereby incorporated by reference in its entirety. By "zero overhead," it is mean that the amount of pad or tolerance that must be built into the threshold value (in order to ensure the incoming signal is not clipped and that the line driver does not consume excess power) is minimized by setting the threshold as closely as possible to the theoretical threshold (disregarding measurement inaccuracies, filter distortion, and the like). A zero overhead Class G line driver makes the threshold determination on the incoming signal while the signal is still in the digital domain, thus improving the accuracy of the determination. Additionally, rather than switch between a first or second sub-amplifier, the preferred embodiment zero overhead line driver employs a single output amplifier with multiple power supplies of distinct voltages. The zero-overhead line driver also employs a peak detector circuit to determine which of the power supplies are to be connected to the supply rail of the output amplifier, and then dynamically switches the output amplifier from one power supply to another power supply. This determination is generally based upon the amplitude of the input data signal: i.e., if the input data signal is above or below a given threshold. The selected power supply is then applied to the supply rail of the amplifier.

Even when the incoming signal peaks can be accurately detected, inaccuracy and inefficiency of the system can still arise because of the distortions introduced by the filters of the system, as discussed above. These inaccuracies can be compensated for, and/or their effects minimized, as described in the following preferred embodiments of the present invention.

Although in the following discussion, it is assumed that the selected power supply is applied to the high voltage rail of the amplifier, and the low voltage rail of the amplifier is grounded at zero volts, those skilled in the art will understand that this arrangement could be modified so that the differing voltages would be selectively applied instead to the low voltage rail of the amplifier, or differing voltages could be selectively applied to either or both voltage rails.

Figure 1:
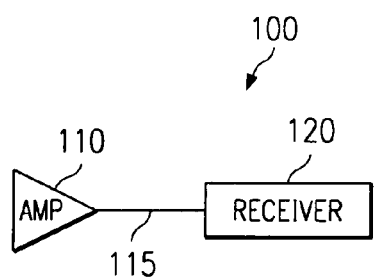
FIG. 1 illustrates one embodiment of a high-level system employing a zero-overhead Class G amplifier for xDSL modems constructed according to the principles of the present invention.

FIG. 1 illustrates one embodiment of a high-level system employing a zero-overhead Class G line driver for, e.g. xDSL modems. In one embodiment, the xDSL system 100 has a zero-overhead Class G line driver 110, a data transmission line 115, and a receiver 120. The zero-overhead Class G line driver 110 dynamically switches among one of a plurality of high voltage sources. A given switched high voltage source is associated with the maximum output voltage of the zero-overhead Class G line driver 110 for any given analog output signal. The analog output signal is then transmitted through the data transmission line 115, to be received by the receiver 120. The present invention may be used anywhere where a Class G amplifier may be used when the data signal starts in the digital domain. Applications of the Class G amplifier include, but are not limited to, audio, video, telecommunications, and various power applications.

Figure 2A:
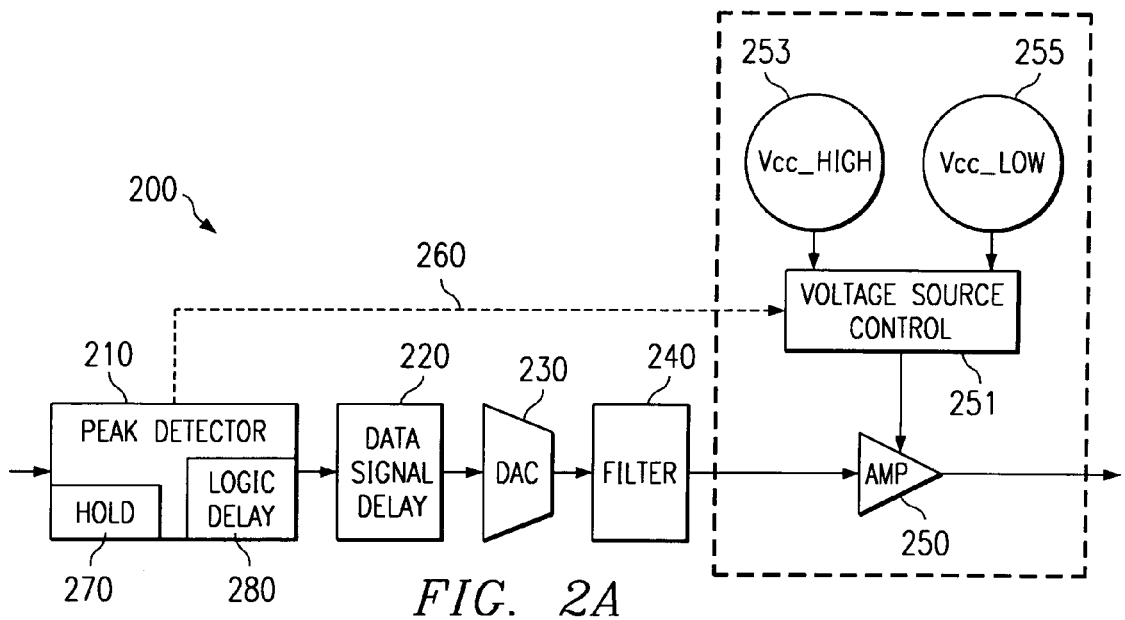
FIG. 2A illustrates a first preferred embodiment of a zero-overhead Class G line driver.

FIG. 2A illustrates a preferred embodiment of a zero-overhead Class G line driver employing a programmable peak detector constructed according to the principles of the present invention. A zero-overhead Class G line driver 200 ("line driver 200") receives a digital input signal into a peak detector 210. The peak detector 210 compares the digital input signal to a threshold value in order to determine whether or not to assert a first logic signal (e.g. a logic "high" signal), as will be described in greater detail, below. Otherwise, a second logic signal (e.g., a logic "low" signal) will be asserted by the peak detector 210. The first and second logic signals configure an amplifier 250 when transmitted through a control line 260, in a manner to be explained below.

The peak detector 210 also transmits the digital input signal to the data signal delay 220. The data signal delay 220 then delays the digital input signal for a programmed number of data samples, for reasons as will be described in greater detail below. The data signal delay 220 then transmits the delayed digital input signal to a digital-to-analog converter (DAC) 230, wherein the digital input signal is converted into an analog signal. Every digital input signal sample received by the DAC 230 has associated with it a "low" signal or a "high" signal on control line 260, as will be detailed below.

From the DAC 230, the analog signal is then filtered by a filter 240. The filter 240 may be a plurality of filters. The filter 240 may introduce potential distortions into the filtered analog signal, such as group delay distortion and passband ripple. Filter 240 also introduces some delay into the signal path. In the presently contemplated preferred embodiment, this delay will be on the order of approximately one sample (or roughly 0.06 μs at a typically sampling rate of 17.664 MHz). This potentially distorted filtered analog signal is then transmitted to the amplifier 250.

The supply rail of the amplifier 250 is dynamically switched to one of a plurality of separate voltage sources of differing voltages, referred to in the present embodiment as a Vcc_high 253 and a Vcc_low 255, by a voltage source control 251, as a function of signals received through the control line 260. There is a "switching time" associated with the dynamic switching of one voltage source to a second voltage source by the voltage source control 251. The switching time may generally be defined as the time allotted by the line driver 200 for the amplifier 250 to completely transfer from a first voltage source to a second voltage source and ensure the sole utilization of the second voltage source by the amplifier 250. Otherwise, after a dynamic switch is initiated, but before the complete switching time has elapsed, the amplifier 250 may operate in an intermediate status wherein the functionality of the amplifier 250 is an intermediate state between the first voltage source and the second voltage source. In the preferred embodiment system, the switching time will typically be in the range of 9 samples, or roughly 0.5 μs. This is roughly an order of magnitude greater than the filter delay. In other embodiments, the switching time may be roughly equivalent to, or in some cases, less than the filter delay. As will be discussed in greater detail below, the switching time can be compensated for by a time delay factor introduced by the data signal delay 220. The time delay factor may also be programmable, as the real-world switching speed the amplifier 250 may differ from its theoretical switching speed.

To restate the above, the voltage source, either Vcc_high 253 or Vcc_low 255, is chosen by the voltage source control 251 based upon the signal received from the peak detector 210. The selected voltage source is then applied to the supply rail of the amplifier 250. Note that, although only two voltage sources are shown, one skilled in the art will recognize that the teachings of the disclosed embodiments could be extended to include three or more different supply voltages and two or more different threshold values by which the supply voltages are selected.

To discuss the above in more detail, the peak detector 210 uses a comparator, versus a threshold value, to determine whether the amplifier 250 should use a higher voltage source (Vcc_high 253) for its voltage supply rail, or whether the amplifier 250 should use a lower voltage source (Vcc_low 255) for its voltage supply rail to amplify any given portion of the analog signal. The choice by the peak detector 210 of the Vcc_high 253 or Vcc_low 255 voltage supply for employment by the amplifier 250 determines both the output characteristics of the amplifier 250 and the power consumption of the line driver 200. If the Vcc_high 253 voltage source is used, the analog output signal should not be clipped, but the line driver 200 would be using more power. If the Vcc_low 255 voltage source is used, the amplifier 200 would be using less power, but there is a possibility that the analog output signal may be clipped.

As mentioned above, the filter 240 introduces some ambiguity into the amplitude of the intermediate signal, as the filter 240 may introduce potential distortions, such as group delay distortion and passband ripple. This distortion can vary over times due to component tolerances and changes due to such factors as temperature, of the line driver 200 and other environmental factors.

Setting an exact threshold value for the peak detector 210 to maximize power conservation efficiency while ensuring no clipping is not practical. Therefore, in one preferred embodiment, the threshold value of the peak detector 210 is lowered to compensate for any potential clipping. The amount by which the threshold value is lowered to compensate for the potential of clipping is called the overhead value of the peak detector 210. The peak detector 210 employs an overhead value to partly compensate for uncertainty in peak determination when setting the threshold. To elaborate, if the filter 240 was not interposed between the peak detector 210 and the amplifier 250, the overhead value could be zero. However, as the filter 240 introduces ambiguity into the filtered analog signal, there is a potential of a clip, and when there is a potential of a clip, there is a potential that the clipped analog output signal will cause bit errors at the receiver. Given that peak detection by the peak detector 210 is implemented prior to the DAC 230, it is impossible to know exactly when peaks at the input of the amplifier 250 will occur.

In particular, due to the ambiguity introduced by the filter 240, the peak detector 210 may locate a peak pre-DAC 230 that does not occur post-filter 240 and vice versa. This has two impacts. First, peaks that are missed may end up being amplified by the amplifier 250 using the lower voltage source, and thus clip. Second, small signals may be amplified by the amplifier 250 using the higher voltage source unnecessarily. The former may cause bit errors. The latter leads to higher power consumption. Note, however, that the switching time of the amplifier 250 also occasionally advantageously masks detection errors. If the peak detector 210 misses a peak entirely, there is a possibility of still not clipping the output analog signal. Specifically, if the amplifier 250 is at some intermediate voltage from switching between two different voltage sources, there is some chance that the peak will not be clipped, and that the amplifier 250 can transmit without clipping.

As discussed above, to help minimize the probability of clipping, the peak detector 210 reduces the threshold by an overhead value. This reduces the probability of clipping at the expense of power consumption. The overhead value represents a trade-off between power efficiency of the line driver 200 and the probability of clipping the analog output signal. In an ideal system in which no signal distortion is introduced between the peak detector and the input to the amplifier, the threshold value would be set at a value such that the ratio of the threshold to the average value (rms) of the input to the peak detector 210 (and hence the amplifier 250) is equal to the ratio of the peak output (at the lower VCC supply rail) to the average value (rms) of the output from the amplifier 250. In real-world applications, however, the ratio must compensate for the distortion that will arise between the input to the peak detector and the input to the amplifier. The overhead value accomplishes this.

The overhead value may be defined in dB relative to the peak-to-average ratio, and the threshold value employed by the peak detector 210 is in turn a function of the overhead value, i.e.

$$\text{threshold} = 10^{[(20*\log 10(VCClow\_peak/tr\_rms) - \text{overhead})/20]} *pd\_rms$$

where Vcc_low_peak is the peak voltage at Tip/Ring that can be supported using Vcc_low 255 voltage source as the supply voltage for the amplifier 250, tr_rms is the rms voltage at Tip/Ring, and pd_rms is the rms voltage seen by the peak detector 210. The final determination of the required overhead itself will depend upon the BER requirements of the given system 100. More specifically, the overhead may typically be dependent on the characteristics of the filters 240, and then determined in order to obtain an acceptable BER. The overhead value may be pre-programmed using the above or similar calculations into the peak detector 210, or the overhead value may be calculated and programmed by the line driver 200 itself as measured characteristics of the system 100 changes.

The peak detector 210 also has associated with it a hold element 270, that may be integrated into the peak detector 210, as shown in FIG. 2A. This hold element 270 ensures that the logical high signal is applied on control line 260 for at least the minimum amount of time required for the amplifier 250 to completely make the switchover from the Vcc_low 255 voltage source to the Vcc_high 253 voltage source when the peak detector 210 generates the first logic signal, i.e. the switching time. Once triggered, the hold element therefore maintains the first logic signal for a given amount of time to the voltage source control 251, ensuring the amplifier 250 has time to make the switchover from the Vcc_low 255 voltage source to the Vcc_high 253 voltage source and stays at Vcc_high 253 while the peak is received. Once the hold element is no longer maintaining the first logic signal, the voltage source control 251, and hence the amplifier 250, then may begin to switch back to employing the Vcc_low 255 voltage source, once the amplifier 250 is no longer receiving the fist logic signal. In other embodiments, the amplifier will stay at Vcc_high 253 until the voltage source control 251 receives the second logic signal from the peak detector 210.

The peak detector 210 also has associated with it a logic signal delay element 280, that may also be integrated into the peak detector 210. In some embodiments, the delay introduced by filter 240 might exceed the switching time. Under those circumstances, the logic signal on control line 260 must be delayed for some period of time after the threshold value is crossed, as detected by peak detector 210. The logic signal delay element 280 ensures that, if the natural delay caused by the filter 240 is longer than the switching time of the amplifier 250, the first logic signal would be delayed by the time equal to the difference between the natural delay of the filter 240 and the switching speed of the amplifier 250 (or, more accurately, of the voltage source control 251). The above-discussed data signal delay 220 would be set to zero under these circumstances.

Conversely, if the natural delay of the filter 240 is shorter than the switching speed of the amplifier 250 (the expected case), the logic signal delay element would be set to have zero time delay, but the data signal delay 220 would delay the digital input signal by a time equal to the difference between the natural delay of the filter 240 and the switching speed of the amplifier 250.

Disclosed is an algorithm which demonstrates the relationship between the various programmable parameters, such as used within the data signal delay 220, the logic signal delay element, and the hold element. The following is a list of parameters and their description:

| | |
|---|---|
| D | "bulk delay" through the filter 240 |
| var | variability in D due to various component tolerances and overall changes in the filter 240 |
| S | the switching time of the amplifier 250 |
| N | the delay time of the data signal delay 220 |
| Delay | delay in asserting a first logic signal by the logic signal delay element |
| Hold | length of time the first logic signal is applied by the hold element |
| Threshold | value used by the peak detector 210 |

Figure 2B:
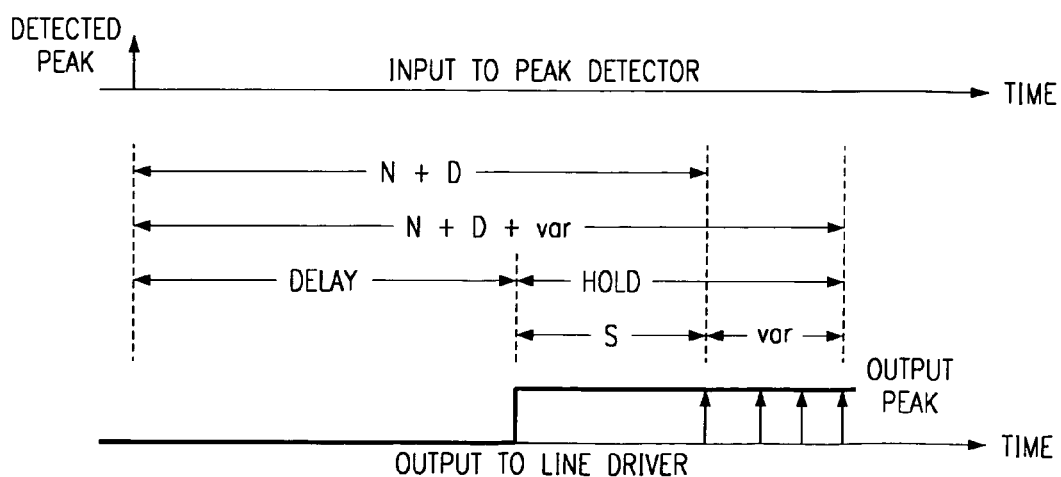
FIG. 2B illustrates a timing diagram of relationships between various parameters of the Class G line driver constructed according to the principles of the present invention.

The relationship between all of the above parameters is illustrated in FIG. 2B. In all cases, the parameters are chosen such that an adequate amplifier 250 switching time is allowed just before the peak of the filtered analog signal reaches the amplifier 250, i.e., N+D samples after being detected. To restate the above, the threshold value is the digital value against which the peak detector 210 compares the absolute value of the incoming digital input signal. Assuming D<S, only N or Delay need to be configurable or programmable. Since all of the above parameters have an impact upon power consumption, it will be desirable to fine-tune these parameters. To facilitate this N (or Delay), Threshold and Hold may be software configurable parameters. Alternatively, any parameter may be a software configurable parameter.

Figure 3:
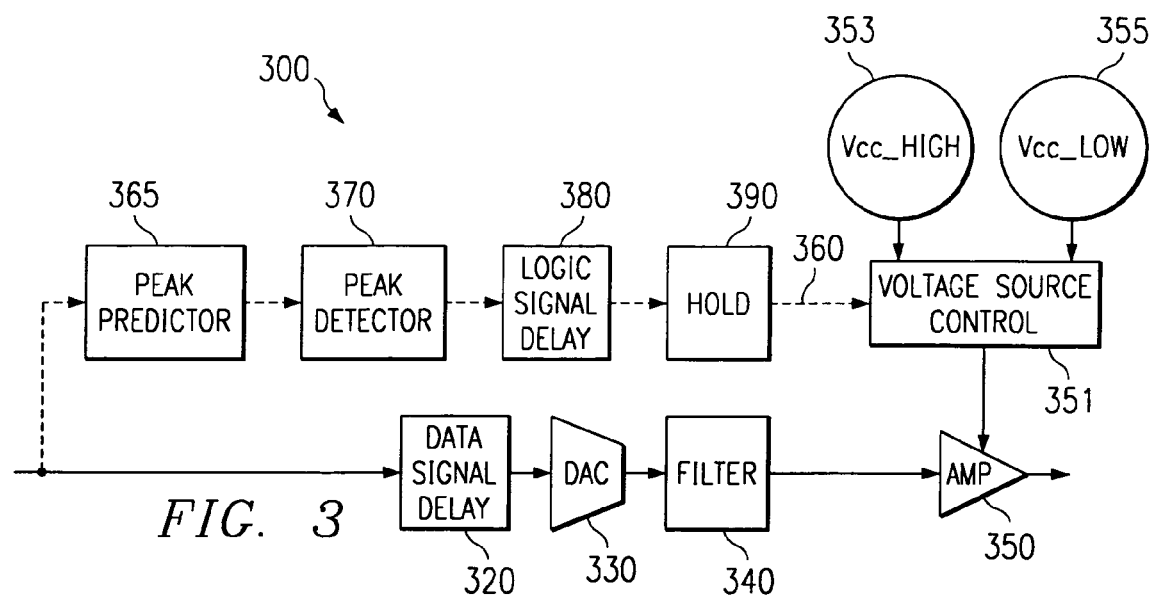
FIG. 3 illustrates an alternative preferred embodiment of a zero-overhead Class G line driver.

If D < S (expected case)
    if N is variable (i.e., Delay is the unused parameter)
        N = S - D
        Delay = 0
    if N is fixed (i.e. N is the unused parameter)
        Delay + N + D - S
    else (included for completeness)
        N = 0
        Delay D - S
        Hold = S + Var Turning now to FIG. 3, disclosed is an alternative preferred embodiment of a zero-overhead Class G line driver employing a programmable peak detector constructed according to the principles of the present invention. A zero-overhead Class G line driver 300 ("line driver 300") has a data signal delay 320, a DAC 330, a filter 340, an amplifier 350, a voltage source control 351, a Vcc_high 353 voltage source, a Vcc_low 355 voltage source, and a control line 360, which operate and are coupled in an analogous manner to the line driver 200. However, the alternative preferred embodiment of the amplifier 300 has an added peak predictor 365, as will be described in more detail, below. Also, a logic signal delay 380 and a hold 390 have been extracted from the functionality of a peak detector 370, as will also be described in more detail, below.

As there may be distortion to the filtered analog signal introduced by the filter 340, it would be useful to be able to try to predict the behavior of the filter 340. The peak predictor 365 analyzes the digital input signal, and then transforms it into an intermediate control signal. The intermediate control signal should ideally emulate the behavior of the filter 340 upon the analog signal, i.e. it should model the distortion imposed by filter 340 and should introduce a similar distortion onto the intermediate signal at its output. The intermediate control signal is in turn transmitted to and acted upon by the peak detector 370. The peak detector 370 then compares the intermediate control signal to a threshold value, to determine whether or not to assert a first logic signal. In an analogous manner to the peak detector 210, the peak detector 370 also employs an overhead value to modify the threshold value.

As the peak predictor 365 has made an approximation of the behavior of the analog signal as it traverses the filter 340, it may be possible to decrease the overhead value implemented within the peak detector 370, and therefore raise the threshold value necessary to achieve an acceptable BER. Raising the threshold of the peak detector 370 would reduce power consumption, as the amplifier 350 would switch less often to the Vcc_high 353 voltage source, thereby consuming less power.

In the line driver 300, logic signal delay 380 and the hold 390 may be implemented separately from the peak detector 370. The voltage source control 351 operates in an analogous manner to the voltage source control 251, and therefore shall not be described in further detail of FIG. 3. Likewise, the logic signal delay 380 and the hold 390 operate in an analogous manner to the high assertion signal delay element and the hold element, respectively, of the peak detector 210 and therefore shall not be described in further detail within the description of FIG. 3. Alternatively, the logic signal delay 380 and the hold 390 could both be implemented within the peak detector 370.

Figure 4:
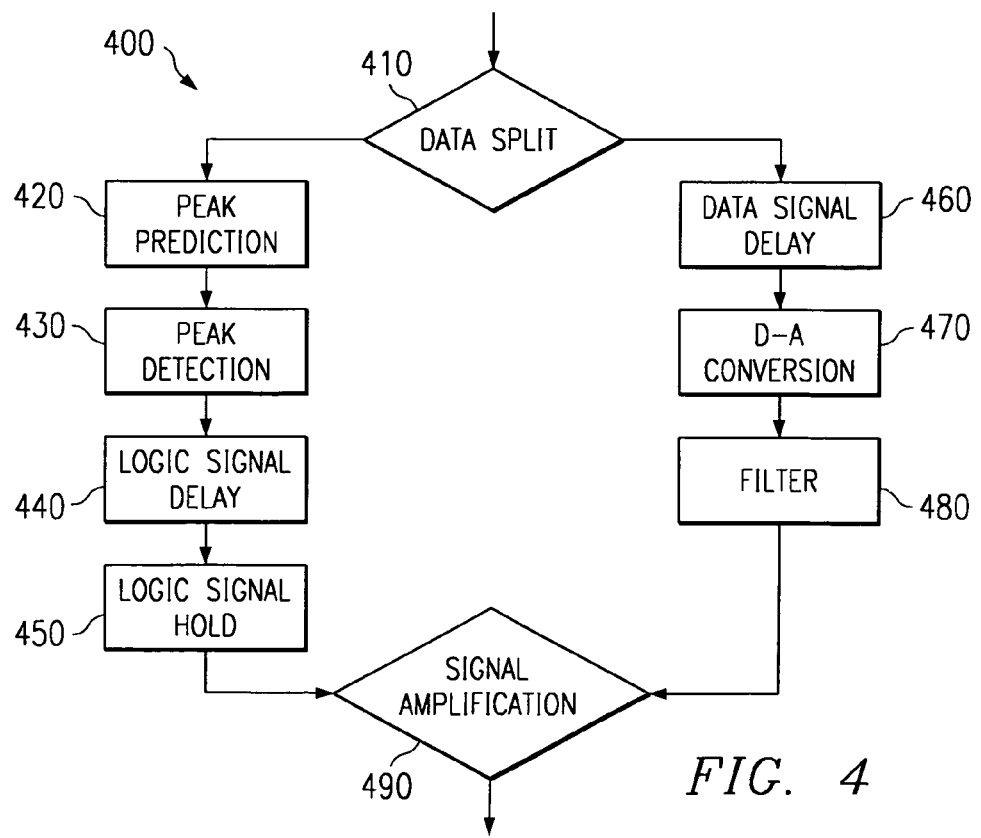
FIG. 4 illustrates a method of use of the zero-overhead Class G line driver employing a programmable peak detector.

Turning now to FIG. 4, disclosed is a preferred embodiment of a method for use of the zero-overhead Class G line driver 400. The digital input signal is first split by a signal split 410. After the step signal split 410, the digital input signal is processed by a peak prediction step 420. Also, the digital input signal is processed by a data signal delay 460.

In peak prediction step 420, the digital input signal is analyzed to predict behavior of the analog signal when it is processed in a filtering step 480. The peak prediction step 420 creates an intermediate control signal, which is employed by in the peak detection step 430.

The peak detection step 430 uses the intermediate control signal, and compares the threshold value to this intermediate control signal to determine whether or not to generate the first logical signal for the amplifier. The threshold value has been modified by the overhead value, as described above.

After the peak detection step 430, a logic signal delay step 440 may delay the first logical signal for a programmed amount of time, as discussed above with reference to FIGS. 2A and 3. After the logic signal delay step 440, a logic signal hold step 450 is executed. The logic signal hold step 450 allows the voltage source control to apply the Vcc_high voltage source for a programmed amount of time when the method 400 executes the amplification step 490.

In the data signal delay step 460, the digital input signal is delayed by a programmed amount of time, as described above. After executing the data signal delay step 460, the method 400 then executes a digital to analog conversion of the digital data input in a D-A conversion step 470, and transforms the digital input signal into an analog signal.

The analog signal is then filtered in a filtering step 480 to create a filtered analog signal. As detailed above, the filtering of the filtering step 480 may introduce distortions into the analog signal, such as group delay, passband ripple, and so on. Peak predictor step 420 and the peak detector step 430 attempt to compensate for this ambiguity.

Finally, the filtered analog signal is amplified in the amplification step 490. The switched high supply voltage connected in the amplification step 490 is a function of the first logic signal, or lack thereof, applied by the peak detector step 430. Alternatively, the high supply voltage is a function of which of the two logic signals, e.g., high or low, is received. The configuration and employment of the amplifier of the amplification step 490 has been detailed above, and will therefore not be described in further detail. Finally, the amplification step 490 produces a final output signal for transmission to a receiver.

The steps or blocks of the above method and systems can be custom hardware or can be run on a general purpose or special purpose processor running software routines, or running firmware routines, or the like. For instance, many of the elements shown in the figures, such as peak predictor 365, data signal delay 320, peak detector 210, and the like, can be realized as software or firmware routines running on, e.g., a digital signal processor or a general purpose processor. In other instances, the elements might be realized as programs or routines being executed by a combination of general or special purpose processor and supporting hardware components. In still other embodiments, the various elements might be realized as custom circuits formed in a programmable integrated circuit such as ASIC, programmable logic array, or the like.

While this invention has been described with reference to illustrative embodiments, this description is not intended to be construed in a limiting sense. Various modifications and combinations of the illustrative embodiments, as well as other embodiments of the invention. For instance, the teaching could extend to three or more voltage rails, with two or more thresholds, etc. As described above, the teaching also could extend to multiple voltage sources coupled to a low voltage rail as a function of a threshold, as well as a high voltage rail. It is therefore intended that the appended claims encompass any such modifications or embodiments.

What is claimed is:

1. A line driver, comprising:
   a signal input;
   a peak detector receiving a digital data signal from the signal input and outputting a logic signal having a first logic value when the digital data signal exceeds a threshold value and a second logic value when the digital data signal is below the threshold value, said threshold value modifiable by an overhead value;
   a data signal delay coupled to the digital data signal input and outputting a time-delayed digital data signal;
   a DAC coupled to the signal input and receiving as input the time-delayed digital data signal and outputting an analog data signal;
   a filter receiving as input the analog data signal and outputting a filtered analog data signal; and
   an amplifier receiving as input the filtered analog data signal from the filter and the logic signal, the amplifier operating at a first operating voltage level when the logic signal is at the first logic value and operating at a second operating voltage level when the logic signal is at the second logic value, wherein the threshold value is associated with a proportionality between a peak value associated with the first operating voltage level and a rms value associated with the first operating voltage level.

2. The line driver of claim 1, wherein the peak detector outputs a third logic value when the digital data signal exceeds a second threshold value and further wherein the amplifier operates at a third operating voltage level when the peak detector outputs said third logic value.

3. The line driver of claim 1 further comprising a logic delay receiving as input said logic signal and outputting a time delayed logical signal.

4. The line driver of claim 3 wherein the amplifier has a switching speed and the time delayed logic signal is delayed by a time substantially equal to the difference in the delay imposed by the filter and the switching speed of the amplifier.

5. The line driver of claim 1 wherein the peak detectors is implemented as a routing running on a processor.

6. The line driver of claim 5 further comprising a hold element receiving as input the logic signal or a time delayed logic signal and maintaining on an output line said logic signal or time delayed logic signal for a predetermined period of time.

7. The line driver of claim 1 further including a peak predictor for receiving the digital data signal from the signal input and outputting an intermediate control signal.

8. The line driver of claim 1 wherein the overhead value is determined empirically.

9. A method of operation of a line driver, comprising the steps of:
   receiving a digital data signal from a signal input and outputting a first logic value when the digital data signal exceeds a threshold value and a second logic value when the digital data signal is below the threshold value, said threshold value modifiable by an overhead value;
   delaying digital data signal by a programmable digital data signal delay value;
   converting the digital data signal to an analog data signal;
   filtering the analog data signal;
   passing the filtered analog data signal to an amplifier operable at a first operating voltage level and a second operating voltage level; and
   selecting between the first operating voltage level and the second operating voltage level in response to the first or second logic value, wherein the threshold value is associated with a proportionality between a peak value associated with the first operating voltage level and a rms value associated with the first operating voltage level.

10. The method of claim 9 further comprising programming a value for the threshold value.

11. The method of claim 10 wherein the threshold value is modified as a function of temperature.

12. The method of claim 9 further comprising holding the first or second logic value for a pre-determined period of time.

13. The method of claim 9 further comprising delaying the logic signal for a predetermined period of time.

14. The method of claim 13 wherein the amplifier has a switching speed and the predetermined period of time is substantially equal to the difference in the delay imposed by the filtering step and the switching speed of the amplifier.

15. The method of claim 9 further comprising predicting a data signal peak based upon a model of the filtering step.

16. The method of claim 9 wherein the threshold value is modified as a function of switching speed of the amplifier.

17. A line driver system, comprising:
a signal input;
a peak detector receiving a digital data signal from the signal input and outputting a logic signal having a first logic value when the digital data signal exceeds a threshold value and a second logic value when the digital data signal is below the threshold value, said threshold value modifiable by an overhead value;
a data signal delay coupled to the digital data signal input employed to output a time delayed digital data signal;
a DAC coupled to the signal input and receiving as input the digital data signal and outputting an analog data signal;
a filter receiving as input the analog data signal and outputting a filtered analog data signal;
an amplifier receiving as input the filtered analog data signal from the filter and the time delayed logic signal, the amplifier operating at a first operating voltage level when the time delayed logic signal is at the first logic value and operating at a second operating voltage level when the logic signal is at the second logic value;
a transmission line coupled to an output of the amplifier; and
a receiver coupled to an output of the transmission line, wherein the threshold value is associated with a proportionality between a between a peak value associated with the first operating voltage level and an rms value associated with the first operating voltage level.

18. The line driver system of claim 17, wherein the overhead is a programmable value.

19. The line driver system of claim 17 further comprising a logic delay receiving as input the logic signal and outputting a time delayed logic signal.

20. The line driver system of claim 19 wherein the amplifier has a switching speed and the time delayed logic signal is delayed by a time substantially equal to the difference in the delay imposed by the filter and the switching speed of the amplifier.

21. The line driver system of claim 17 further comprising a hold element coupled between said peak detector and said amplifier.

22. The line driver system of claim 21 wherein the hold element is configured to maintain the logic signal as a control input to the amplifier for a predetermined amount of time.

23. The line driver system of claim 17 further including a peak predictor receiving as input the digital data signal from the signal input and outputting an intermediate control signal having distortion characteristics similar to the distortion characteristics of the filter.

24. The line driver system of claim 17 wherein the overhead value is determined empirically.

* * * * *